United States Patent
Yu et al.

(10) Patent No.: US 8,710,632 B2
(45) Date of Patent: Apr. 29, 2014

(54) COMPOUND SEMICONDUCTOR EPITAXIAL STRUCTURE AND METHOD FOR FABRICATING THE SAME

(75) Inventors: Tien-Wei Yu, Kaohsiung (TW); Chin-Cheng Chien, Tainan (TW); I-Ming Lai, Kaohsiung (TW); Shin-Chi Chen, Penghu County (TW); Chih-Yueh Li, Taipei (TW); Fong-Lung Chuang, Hsinchu (TW); Chin-I Liao, Tainan (TW); Kuan-Yu Lin, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/606,007

(22) Filed: Sep. 7, 2012

(65) Prior Publication Data

US 2014/0070377 A1    Mar. 13, 2014

(51) Int. Cl.
*H01L 21/02*    (2006.01)

(52) U.S. Cl.
USPC ................... 257/655; 257/E29.24

(58) Field of Classification Search
USPC ......... 257/314, 315, E21.09, E21.215, E21.4, 257/E21.092, E21.097, 655; 438/299, 300, 438/301, 478, 745
See application file for complete search history.

(56) References Cited

U.S. PATENT DOCUMENTS

| | | | |
|---|---|---|---|
| 4,891,303 A | 1/1990 | Garza | |
| 5,217,910 A | 6/1993 | Shimizu | |
| 5,273,930 A | 12/1993 | Steele | |
| 5,356,830 A | 10/1994 | Yoshikawa | |
| 5,372,957 A | 12/1994 | Liang | |
| 5,385,630 A | 1/1995 | Philipossian | |
| 5,399,506 A | 3/1995 | Tsukamoto | |
| 5,625,217 A | 4/1997 | Chau | |
| 5,777,364 A | 7/1998 | Crabbe | |
| 5,783,478 A | 7/1998 | Chau | |
| 5,783,479 A | 7/1998 | Lin | |
| 5,960,322 A | 9/1999 | Xiang | |
| 6,030,874 A | 2/2000 | Grider | |
| 6,048,756 A | 4/2000 | Lee | |
| 6,074,954 A | 6/2000 | Lill | |
| 6,100,171 A | 8/2000 | Ishida | |
| 6,110,787 A | 8/2000 | Chan | |
| 6,165,826 A | 12/2000 | Chau | |
| 6,165,881 A | 12/2000 | Tao | |
| 6,191,052 B1 | 2/2001 | Wang | |
| 6,228,730 B1 | 5/2001 | Chen | |

(Continued)

OTHER PUBLICATIONS

Han, J.P., et al., Novel Enhanced Stressor with Graded Embedded SiGe Source/Drain for High Performance CMOS Devices, Electron Devices Meeting, 2006. IEDM '06. International, Dec. 11-13, 2006, pp. P.1-P.4, Conference Publications, San Francisco, CA.

(Continued)

*Primary Examiner* — Yu-Hsi D Sun
*Assistant Examiner* — Christina Sylvia
(74) *Attorney, Agent, or Firm* — Ding Yu Tan

(57) ABSTRACT

A method for fabricating a compound semiconductor epitaxial structure includes the following steps. Firstly, a first compound epitaxial layer is formed on a substrate. Then, a continuous epitaxial deposition process is performed to form a second compound epitaxial layer on the first compound epitaxial layer, so that the second compound epitaxial layer has a linearly-decreased concentration gradient of metal. Afterwards, a semiconductor material layer is formed on the second compound epitaxial layer.

16 Claims, 9 Drawing Sheets

(56) References Cited

U.S. PATENT DOCUMENTS

| | | |
|---|---|---|
| 6,274,447 B1 | 8/2001 | Takasou |
| 6,274,894 B1 * | 8/2001 | Wieczorek et al. ............ 257/192 |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,288,822 B1 | 10/2007 | Ting |
| 7,303,999 B1 | 12/2007 | Sriraman |
| 7,335,959 B2 | 2/2008 | Curello |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,592,231 B2 | 9/2009 | Cheng |
| 7,667,227 B2 | 2/2010 | Shimamune |
| 7,691,752 B2 | 4/2010 | Ranade |
| 7,838,370 B2 | 11/2010 | Mehta |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0166929 A1 | 7/2007 | Matsumoto |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0128765 A1 * | 6/2008 | Chen et al. ............ 257/288 |
| 2008/0142886 A1 | 6/2008 | Liao |
| 2008/0157119 A1 * | 7/2008 | Tsai ............ 257/190 |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0166625 A1 | 7/2009 | Ting |
| 2009/0184402 A1 | 7/2009 | Chen |
| 2009/0186475 A1 | 7/2009 | Ting |
| 2009/0246922 A1 | 10/2009 | Wu |
| 2009/0278170 A1 | 11/2009 | Yang |
| 2009/0302348 A1 | 12/2009 | Adam |
| 2010/0001317 A1 | 1/2010 | Chen |
| 2010/0093147 A1 | 4/2010 | Liao |
| 2011/0254105 A1 * | 10/2011 | Cheng et al. ............ 257/408 |

OTHER PUBLICATIONS

H. K. Chiu, T. L. Lin, Y. Hu, K. C. Leou, H. C. Lin, M. S. Tsai, and T. Y. Huang, Characterization of titanium nitride etch rate and selectivity to silicon dioxide in a $Cl_2$ helicon-wave plasma, Journal of Vacuum Science & Technology A: Vacuum, Surfaces, and Films, Mar. 2001, p. 455-459, vol. 19, Issue 2, American Vacuum Society, Website.

U.S. Appl. No. 13/189,570, filed Jul. 25, 2011.

* cited by examiner

COMPOUND SEMICONDUCTOR EPITAXIAL STRUCTURE AND METHOD FOR FABRICATING THE SAME

FIELD OF THE INVENTION

The present invention relates to a semiconductor device and a method for fabricating the semiconductor device, and more particularly to a compound semiconductor epitaxial structure and a method for fabricating the compound semiconductor epitaxial structure.

BACKGROUND OF THE INVENTION

With the technological advances of the communication equipment and other electronic equipment, the operating speed of the semiconductor device becomes faster and faster. For increasing the mobility of electrons and holes in the semiconductor device, compound semiconductor epitaxial structures are widely used in a variety of semiconductor applications. For example, the compound semiconductor epitaxial structure may be used in the fabrication of a metal-oxide-semiconductor field-effect transistor (MOSFET).

Because the lattice constant of the silicon germanium epitaxial material is larger than that of the monocrystalline silicon substrate, a compressive stress may be applied to the channel region between the source region and the drain region in order to enhance the carrier mobility. As a consequence, the silicon germanium epitaxial material is conventionally used to form a silicon germanium epitaxial structure. The silicon germanium epitaxial structure serves as the major component of the source/drain regions of the transistor in order to enhance the device performance of the semiconductor device.

However, it is found that a germanium agglomeration phenomenon is generated during the silicide process of fabricating the silicon germanium epitaxial structure. Moreover, since the lattice constant of silicon is different from that of germanium, the interfacial lattice mismatch between the silicon germanium epitaxial structure and the silicon substrate, and between the silicon germanium epitaxial structure and other material layers formed on the silicon germanium epitaxial structure in the subsequent processes will result in a delamination problem.

Therefore, there is a need of providing an advanced method for fabricating the compound semiconductor epitaxial structure in order to eliminate the above drawbacks and increase the performance of the semiconductor device.

SUMMARY OF THE INVENTION

In accordance with an aspect, the present invention provides a method for fabricating a compound semiconductor epitaxial structure. The method includes the following steps. Firstly, a first compound epitaxial layer is formed on a substrate. Then, a continuous epitaxial deposition process is performed to form a second compound epitaxial layer on the first compound epitaxial layer, so that the second compound epitaxial layer has a linearly-decreased concentration gradient of metal. Afterwards, a semiconductor material layer is formed on the second compound epitaxial layer.

In an embodiment, the first compound epitaxial layer has a metal concentration greater than or equal to an initial concentration of the linearly-decreased concentration gradient of metal.

In an embodiment, during the step of performing the continuous epitaxial deposition process to form the second compound epitaxial layer, the flow rate of a metal-containing reactive gas is controlled to be linearly decreased. In an embodiment, the formation of the second compound epitaxial layer further comprises steps of keeping the flow rates of the metal-containing reactive gas constant for a predetermined interval of time.

In an embodiment, the first compound epitaxial layer is a silicon germanium bulk layer, and the metal-containing reactive gas comprises a germane gas.

In an embodiment, during the step of performing the continuous epitaxial deposition process to form the second compound epitaxial layer, a mass flow controller is used to adjust the flow rates of the germane gas, a hydrogen chloride gas and a diborane gas, so that the flow rate of the germane gas is linearly decreased or is kept constant for a predetermined interval of time.

In an embodiment, the first compound epitaxial layer is further boron-doped.

In an embodiment, before the first compound epitaxial layer is formed, the method further includes a step of forming an undoped silicon germanium layer on the substrate.

In an embodiment, the undoped silicon germanium layer has a linearly-increased concentration gradient of germanium.

In an embodiment, during the step of forming the undoped silicon germanium layer, a mass flow controller is used to adjust the flow rates of the germane gas and a hydrogen chloride gas, so that the flow rate of the germane gas is linearly increased or is kept constant for a predetermined interval of time.

In an embodiment, the step of forming the first compound epitaxial layer and the step of forming the second compound epitaxial layer are carried out at the same temperature.

In accordance with another aspect, the present invention provides a compound semiconductor epitaxial structure. The compound semiconductor epitaxial structure includes a substrate, a first compound epitaxial layer, a second compound epitaxial layer, and a semiconductor material layer. The first compound epitaxial layer is formed on a substrate. The second compound epitaxial layer is formed on the first compound epitaxial layer, wherein the second compound epitaxial layer has a linearly-decreased concentration gradient of metal. The semiconductor material layer is formed on the second compound epitaxial layer.

In an embodiment, the first compound epitaxial layer has a metal concentration greater than or equal to an initial concentration of the linearly-decreased concentration gradient of metal.

In an embodiment, the first compound epitaxial layer is a silicon germanium bulk layer, which contains 40 wt % of germanium and is doped with 25 wt % of boron, wherein the second compound epitaxial layer has a linearly-decreased concentration gradient of germanium.

In an embodiment, the compound semiconductor epitaxial structure further includes an undoped silicon germanium layer, wherein the undoped silicon germanium layer is arranged between the substrate and the first compound epitaxial layer. In an embodiment, the undoped silicon germanium layer has a linearly-increased concentration gradient of germanium.

In an embodiment, a top surface of the first compound epitaxial layer is higher than the substrate by a height difference.

In an embodiment, the height difference between the top surface of the first compound epitaxial layer and the substrate is in a range between 150 Å and 170 Å.

In an embodiment, the second compound epitaxial layer has a thickness smaller than 100 Å.

In an embodiment, the thickness of the second compound epitaxial layer is in a range between 30 Å and 100 Å.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

As previously described herein, the interfacial lattice mismatch may result in stress relaxation of the compound epitaxial structure and thereby reduce the device performance. For solving the above drawbacks, the present invention provides a compound semiconductor epitaxial structure and a method for fabricating the compound semiconductor epitaxial structure. The above and other objects, features and advantages of the present invention will become more readily apparent to those ordinarily skilled in the art after reviewing the following detailed description and accompanying drawings. An embodiment of a method for fabricating a metal-oxide-semiconductor field-effect transistor with a compound epitaxial structure in accordance with the present invention will be illustrated below.

FIGS. 1A~1E are schematic cross-sectional views illustrating the method for fabricating a metal-oxide-semiconductor field-effect transistor 10 with a compound epitaxial structure 100 according to the embodiment of the present invention.

Figure 1A:
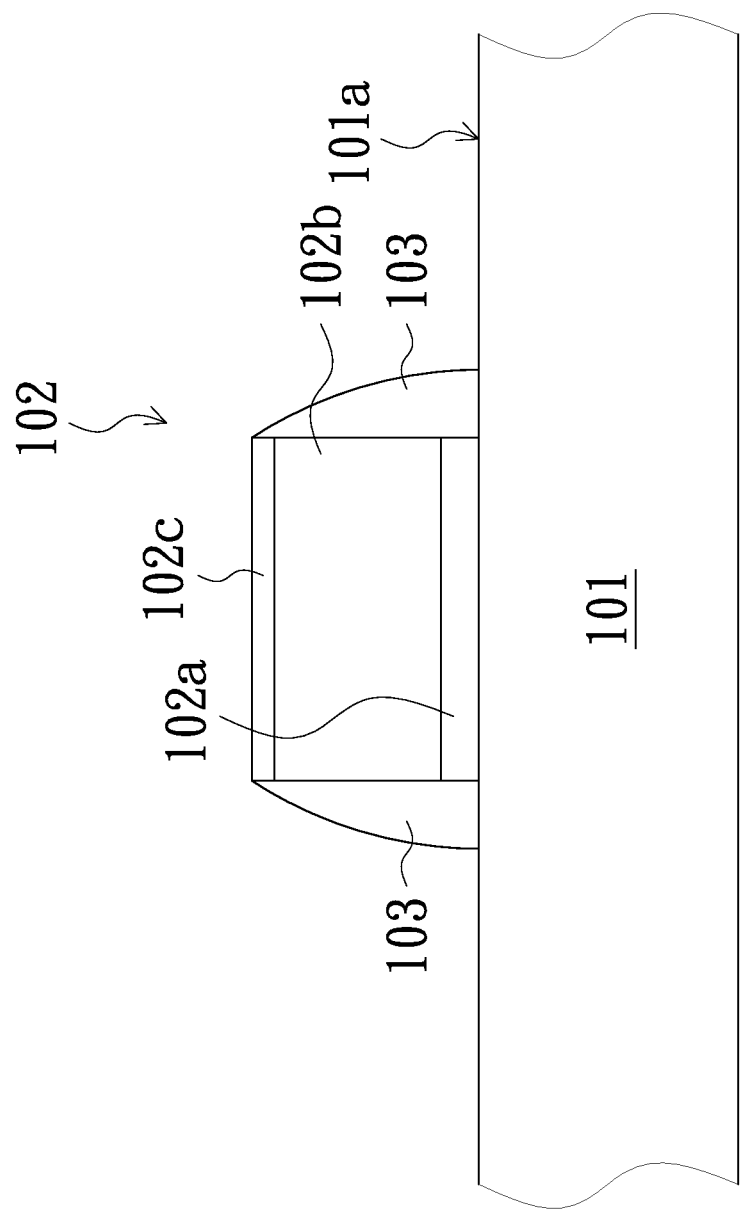
FIGS. 1A-1E are schematic cross-sectional views illustrating a method for fabricating a metal-oxide-semiconductor field-effect transistor with a compound epitaxial structure according to an embodiment of the present invention.

The method for fabricating the metal-oxide-semiconductor field-effect transistor 10 comprises the following steps. Firstly, as shown in FIG. 1A, a substrate 101 is provided, and a gate structure 102 is formed on a surface 101a of the substrate 101.

In this embodiment, the substrate 101 is a silicon wafer. The gate structure 102 comprises a gate dielectric layer 102a and a gate conductor layer 102b. The gate dielectric layer 102a is formed on the surface 101a of the substrate 101. The gate conductor layer 102b is formed on the gate dielectric layer 102a. More preferably, a spacer 103 is formed on a sidewall of the gate structure 102. In addition, a gate cap layer 102c is formed over the gate conductor layer 102b.

Figure 1B:
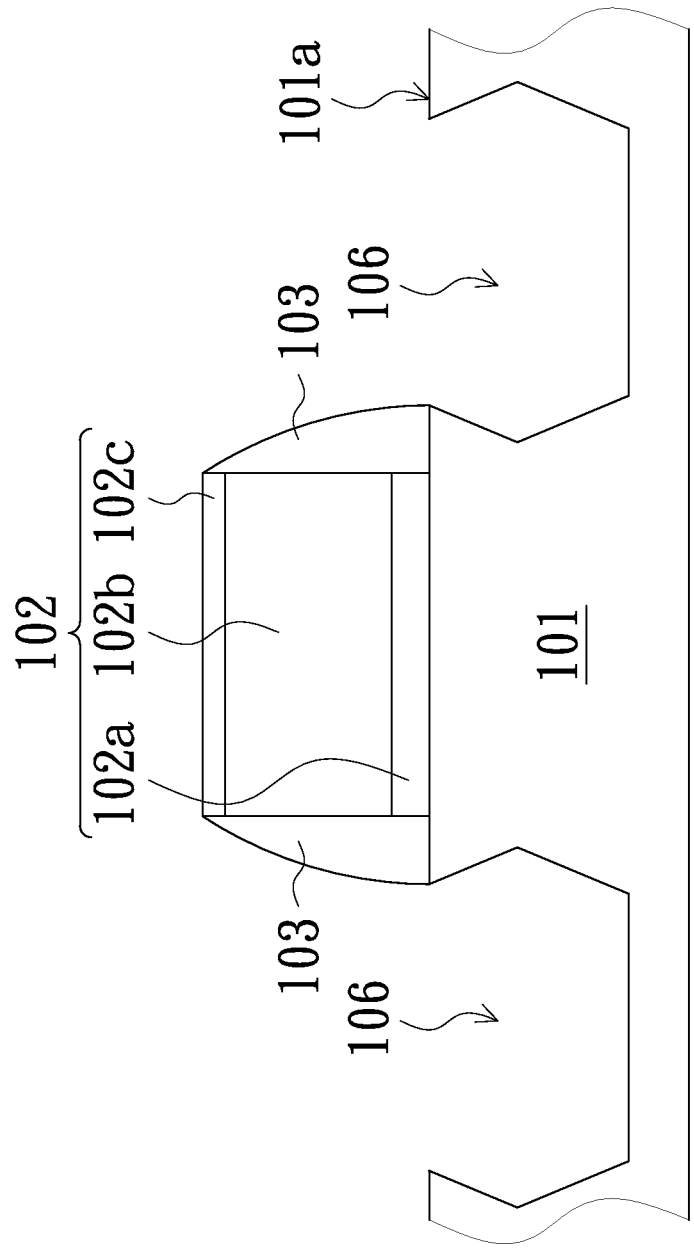

Then, as shown in FIG. 1B, a trench structure 106 is formed in the substrate 101. The trench structure 106 is located beside the gate structure 102. For example, the trench structure 106 is formed by performing an isotropic etching process to partially remove the substrate 101 at both sides of the spacer 103. In this embodiment, the depth of the trench structure 106 is in the range between 700 nm and 800 nm. Moreover, the trench structure 106 is extended to the region under the space 103. Optionally, after the trench structure 106 is formed, a pre-cleaning process is performed to clean the surface of the substrate 101 at the bottom of the trench structure 106.

Figure 1C:
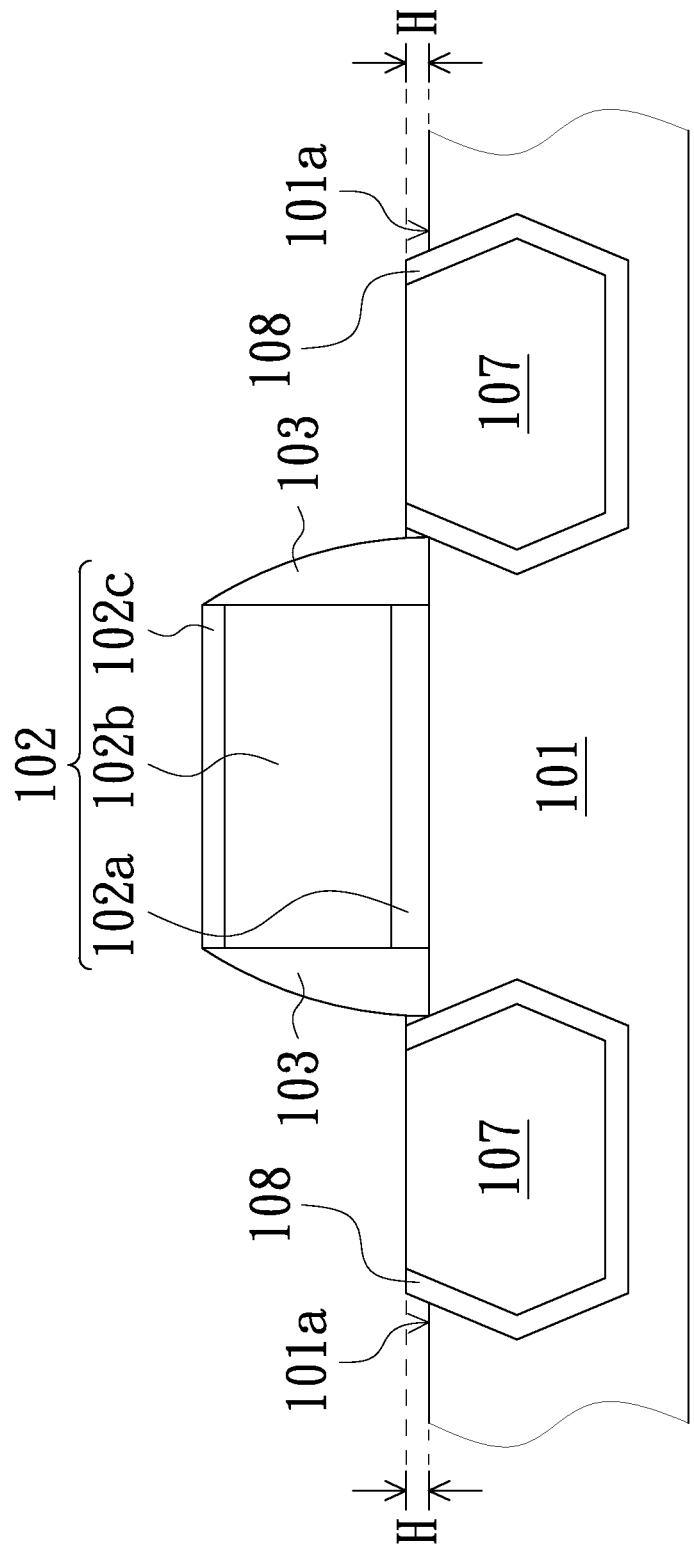

Then, as shown in FIG. 1C, a silicon germanium epitaxial layer 107 is formed in the trench structure 106 serving as the source/drain regions of the metal-oxide-semiconductor field-effect transistor 10. In some embodiments, the silicon germanium epitaxial layer 107 is formed by performing a chemical vapor deposition process. In the chemical vapor deposition process, a mixture of a germane gas ($GeH_4$), a dichlorosilane gas ($SiH_2Cl_2$) and a diborane gas ($B_2H_6$) is used as a (precursor) reactive gas, and a hydrogen gas ($H_2$), a nitrogen gas ($N_2$) or a hydrogen chloride gas (HCl) is served as a carrier gas. Consequently, a silicon germanium bulk layer containing 40 wt % or more of germanium and 25 wt % of boron dopant is deposited within the trench structure 106. More preferably, the silicon germanium epitaxial layer 107 is filled in the trench structure 106 and formed over the surface 101a of the substrate 101 by a height difference H. The height difference H between the top surface of the silicon germanium epitaxial layer 107 and the surface 101a of the substrate 101 is in the range between 150 Å and 170 Å.

In this embodiment, the content of germanium and the concentration of the boron dopant in the silicon germanium epitaxial layer 107 may be controlled by using a mass flow controller (MFC) to adjust the flow rates of the germane gas, the hydrogen chloride gas and the diborane gas. For example, by adjusting the flow rates of the germane gas, the hydrogen chloride gas and the diborane gas, the concentration and distribution of the boron dopant in the silicon germanium epitaxial layer 107 are correspondingly controlled. Consequently, the silicon germanium epitaxial layer 107 may contain 40 wt % of germanium and a linear gradient concentration of boron dopant varying with thickness thereof or otherwise contain a constant concentration of boron dopant. Alternatively, in some other embodiments of the present invention, a silane gas ($SiH_4$) or a disilane gas ($Si_2H_6$) is used as the reactive gas in the above chemical vapor deposition process in order to replace the dichlorosilane gas.

In some other embodiments of the present invention, an undoped silicon germanium layer 108 is formed on an inner surface of the trench structure 106 before the silicon germanium epitaxial layer 107 is formed. The arrangement of the undoped silicon germanium layer 108 can inhibit external diffusion of the boron dopant to prevent serious problems due to boron diffusion. Consequently, the electrical punch-through effect and the short channel effect resulting from boron diffusion, which is a serious problem, will be avoided. The method of forming the undoped silicon germanium layer 108 is similar to the method of forming the silicon germanium epitaxial layer 107, except that the diborane gas is not used as the precursor reactive gas in forming the undoped silicon germanium layer 108. In this embodiment, the undoped silicon germanium layer 108 contains 25 wt % of germanium.

In some other embodiments, for improving the lattice mismatch between the substrate 101 and the silicon germanium epitaxial layer 107, a mass flow controller may be used to adjust the flow rates of the germane gas, the silane gas (the dichlorosilane gas or the disilane gas) and the hydrogen chloride gas during the process of forming the undoped silicon germanium layer 108. That is, the flow rate of the germane gas is linearly increased with the deposition time. Consequently, the undoped silicon germanium layer 108 has a linearly-increased concentration gradient of germanium varying with thickness thereof.

Figure 4:
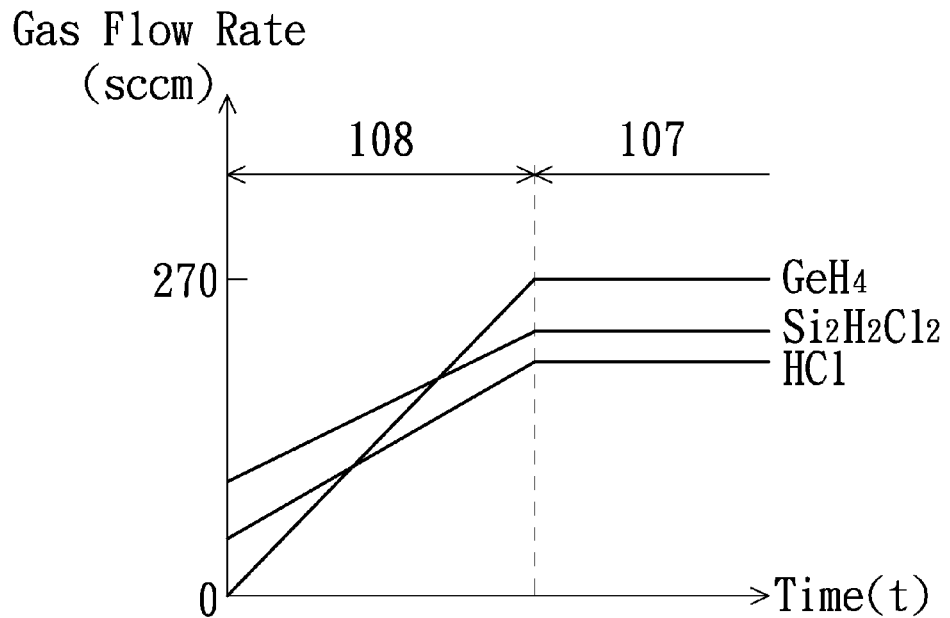
FIG. 4 illustrates flow rates of the silane gas and the hydrogen chloride gas with respect to the operating time in some other embodiments.

For example, during the process of depositing the undoped silicon germanium layer 108, the mass flow controller is used to control the flow rate of the germane gas to be linearly increased from 0 sccm (initial condition) to 270 sccm within 600 seconds of the operating time. Meanwhile the flow rates of the silane gas (dichlorosilane gas or disilane gas) and the hydrogen chloride gas may be also linearly increased with the operating time (see FIG. 4) or kept constant from the beginning. In some embodiments, the flow rates of the silane gas (dichlorosilane gas or disilane gas) and the hydrogen chloride gas are linearly increased from 0 sccm. Consequently, the germanium concentration of the undoped silicon germanium layer 108 is linearly increased from 0 wt % to 40 wt % as the thickness thereof is increased.

Figure 5:
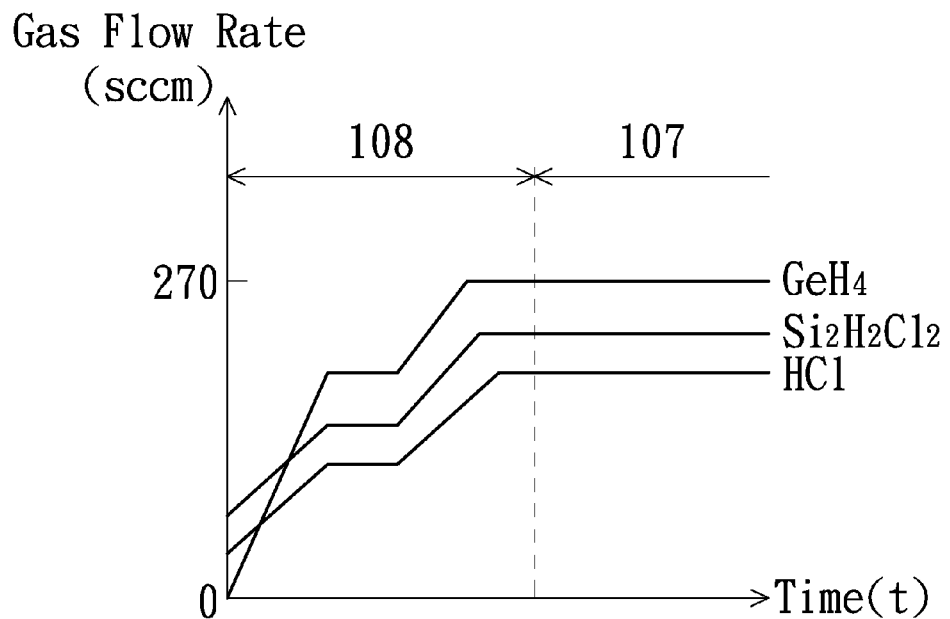
FIG. 5 illustrates flow rates of the silane gas and the hydrogen chloride gas controlled in a stepped increase mode with the deposition time in some embodiments.

In some embodiments, for increasing the germanium content in the undoped silicon germanium layer 108, after the flow rate of the germane gas is linearly increased for a period of time, the flow rate of the germane gas may be kept constant for a predetermined interval of time, and the linearly increased-constant flow rate pattern as described may be repeated as needed. Such that the germane concentration distribution of the undoped silicon germanium layer 108 can be controlled in a stepped increase mode with the thickness thereof, so as to enhance its stress effect. Meanwhile the flow rates of the silane gas (dichlorosilane gas or disilane gas) and the hydrogen chloride gas may be also controlled in a stepped increase mode with the deposition time (see FIG. 5). However, in some other embodiments of the present invention, the flow rates of the silane gas (dichlorosilane gas or disilane gas) and the hydrogen chloride gas may be kept constant from the beginning.

It should be appreciated that the flow rates of the germane gas, the silane gas (dichlorosilane gas or disilane gas) and the hydrogen chloride gas and the time intervals may be adjusted according to the distribution of the germanium concentration predetermined by the operators. And after the undoped silicon germanium layer 108 is formed, the process of depositing the undoped silicon germanium layer 108 may be continued by using the germane gas, the silane gas (dichlorosilane gas or disilane gas), the hydrogen chloride gas and the additional diborane gas as the precursor reactive gas to form the silicon germanium epitaxial layer 107 in situ.

Figure 1D:
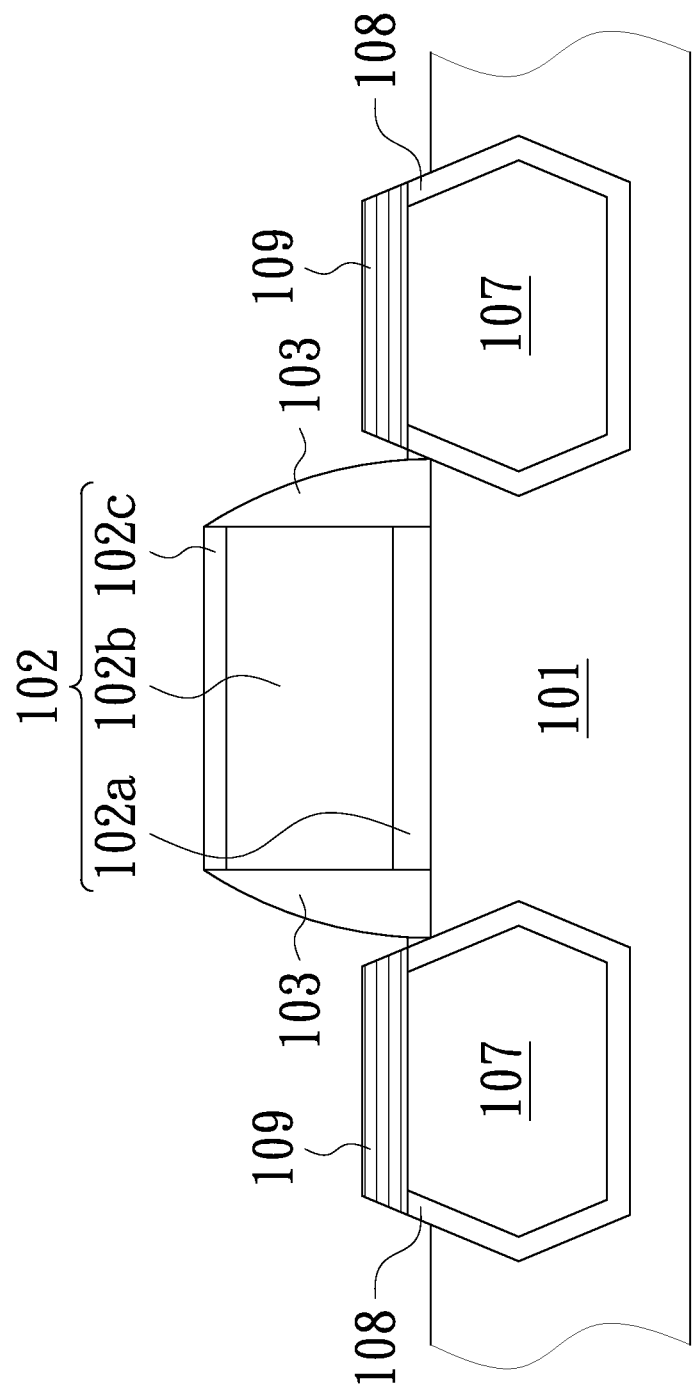

After the silicon germanium epitaxial layer 107 is formed, as shown in FIG. 1D, an in-situ process is performed to form a liner layer 109 which is made of another silicon germanium epitaxial material concentration profile. Consequently, the liner layer 109 has a linearly-decreased concentration gradient of germanium varying with thickness thereof. In this embodiment, the initial germanium concentration of the linearly-increased concentration gradient of germanium of the liner layer 109 is equal to or smaller than the germanium concentration of the silicon germanium epitaxial layer 107 (i.e. may be smaller than 40 wt %), and preferably is equal to the germanium concentration of the silicon germanium epitaxial layer 107. Moreover, the initial germanium concentration of the linearly-increased concentration gradient of germanium of the liner layer 109 is 25 wt %.

The method of forming the liner layer 109 is substantially similar to the method of forming the silicon germanium epitaxial layer 107, except that the germanium concentration distribution of the liner layer 109 is distinguished. In some embodiments, by using a mass flow controller to adjust the flow rates of the germane gas, the hydrogen chloride gas, the silane gas (dichlorosilane gas or disilane gas) and the diborane gas during the process of depositing the liner layer 109, the flow rate of the germane gas is linearly decreased with the deposition time. Consequently, a silicon germanium epitaxial liner layer having a thickness of 30~100 Å and a linearly-decreased concentration gradient of germanium varying with thickness of the silicon germanium epitaxial liner layer is formed. In another embodiment, during the process of depositing the liner layer 109, the flow rate of the germane gas is linearly decreased from 270 sccm (initial) to 0 sccm within 200 seconds of the operating time. Meanwhile the flow rates of the hydrogen chloride gas, the diborane gas and the silane gas (dichlorosilane gas or disilane gas) may be also linearly decreased with the operating time or kept constant from the beginning. Preferably, the flow rates of the hydrogen chloride gas, the diborane gas and the silane gas (dichlorosilane gas or disilane gas) are linearly decreased along with the decreasing flow rate of the germane gas, such that, the growth rate of the liner layer 109 can be substantially kept constant, and the process can be controlled more easily. For example, during the process of depositing the liner layer 109, the flow rate of the diborane gas is linearly decreased from 60 sccm (initial) to 0 sccm within 200 seconds of the operating time (see FIG. 6). Consequently, the thickness of the liner layer 109 is substantially 80 Å, and the germanium concentration of the liner layer 109 is linearly decreased from 25 wt % to 0 wt % as the thickness of the liner layer 109 is increased.

In some embodiments, for increasing the germanium content in the liner layer 109, after the flow rate of the germane gas is linearly decreased for a period of time, the flow rate of the germane gas may be kept constant for a predetermined interval of time, and the linearly decreased-constant flow rate pattern as described may be repeated. Such that the flow rate of the germane gas can be controlled in a stepped decrease mode with the deposition time. Meanwhile the flow rates of the diborane gas and the hydrogen chloride gas may be also controlled in a stepped decrease mode with the deposition time. In addition, to keep the liner layer 109 growing at a steady rate, the flow rates of the hydrogen chloride gas should be decreased or kept constant simultaneously with the variation of the flow rate of the germane gas. And in the present embodiment, the flow rates of the silane gas (dichlorosilane gas or disilane gas) is kept constant from the beginning (see FIG. 7).

In this context, the in-situ process indicates that the silicon germanium epitaxial layer 107 and the liner layer 109 are produced in the same reaction chamber or the same processing machine. In some embodiments, the deposition temperature of forming the liner layer 109 is identical to the deposition temperature of forming the silicon germanium epitaxial layer 107. Alternatively, in some other embodiments, the undoped silicon germanium layer 108 and the silicon germanium epitaxial layer 107 and the liner layer 109 may be produced in-situ in the same reaction chamber or the same processing machine.

Figure 1E:
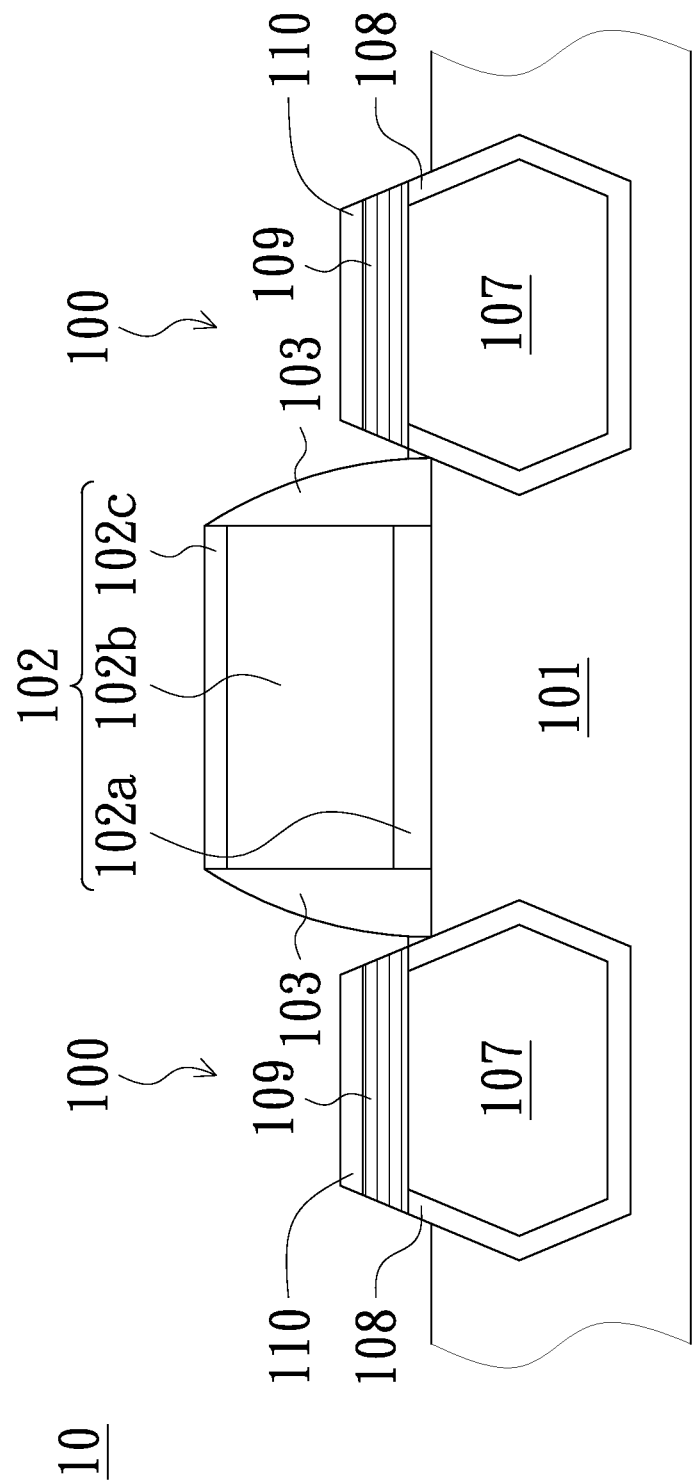

Next, as shown in FIG. 1E, a cap layer 110 is formed on the liner layer 109. Meanwhile, the compound semiconductor epitaxial structure 100 of the metal-oxide-semiconductor field-effect transistor 10 is produced. In one embodiment of present invention, the cap layer 110 is formed by depositing a silicon material layer on the liner layer 109. In some embodiments of present invention, the thickness of the cap layer 110 substantially ranges from 50 Å to 150 Å.

Figure 6:
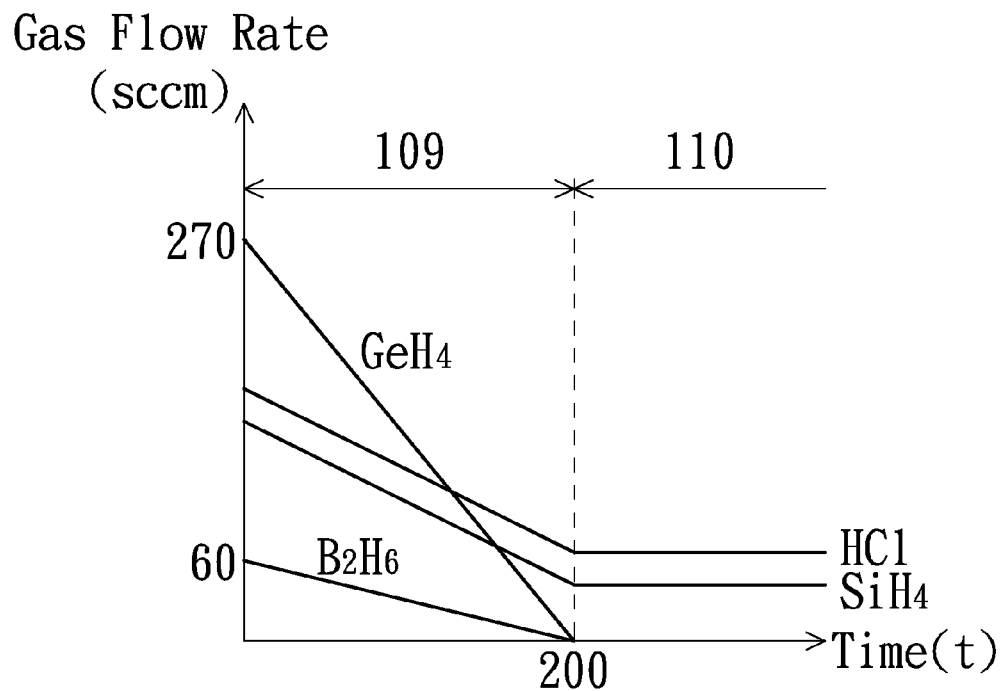
FIG. 6 illustrates flow rate of the diborane gas being linearly decreased with respect to the operating time during the process of depositing the liner layer in another embodiment.
Figure 7:
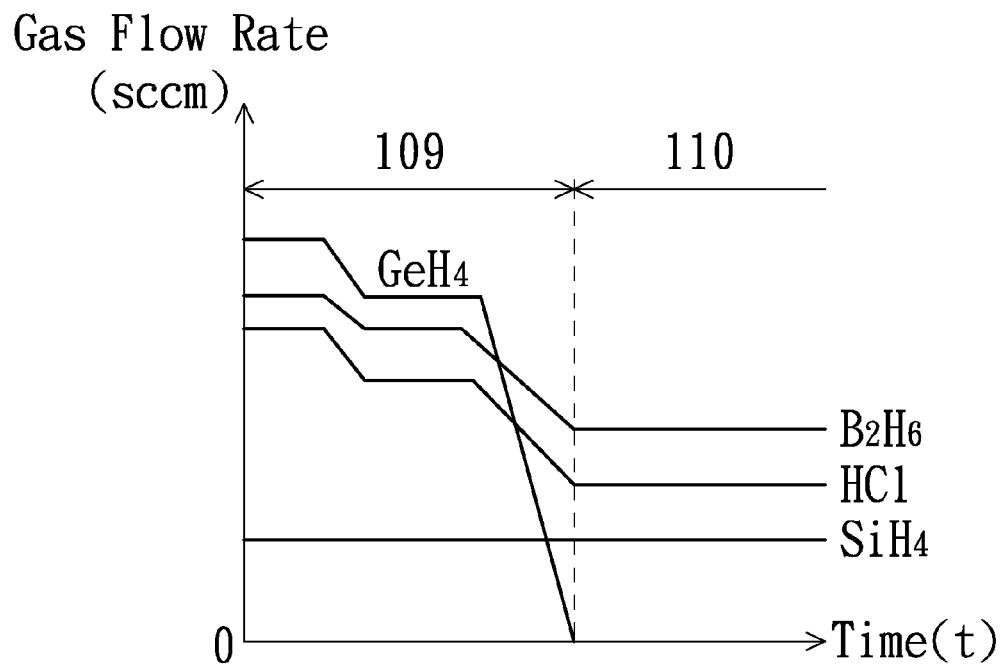
FIG. 7 illustrates flow rate of the silane gas being kept constant in the present embodiment.

In some embodiments of the present invention, the process of depositing liner layer 109 may be continued by using the silane gas (dichlorosilane gas or disilane gas), the hydrogen chloride gas and the diborane gas as the precursor reactive gas to form the cap layer 110 in situ. As shown in FIGS. 6 and 7, the flow rates of the silane gas (dichlorosilane gas or disilane gas), the hydrogen chloride gas and the diborane gas, which continue form the end of the liner layer 109 depositing process, are kept constant to form the cap layer 110.

As previously described in the background of the invention, because of the interfacial lattice mismatch between adjacent layers of the multilayered silicon germanium epitaxial liner structure, the compressive stress is readily relaxed. According to the embodiments of the present invention, since the liner layer 109 is a single-layered structure whose germanium concentration is linearly decreased with thickness thereof, the problem due to lattice mismatch between adjacent silicon germanium epitaxial liner layers will be eliminated. As a result, the stress relaxation problem of the silicon germanium epitaxial structure will be minimized.

For better understanding of the features and advantages of the liner layer 109, a series of tests are performed in order to compare several comparison examples with the compound semiconductor epitaxial structure 100 of FIG. 1E of the embodiment of the present invention. These tests include strain and relaxation tests by using the X-ray diffraction spectra and the atomic force microscopy (AFM).

Figure 2:
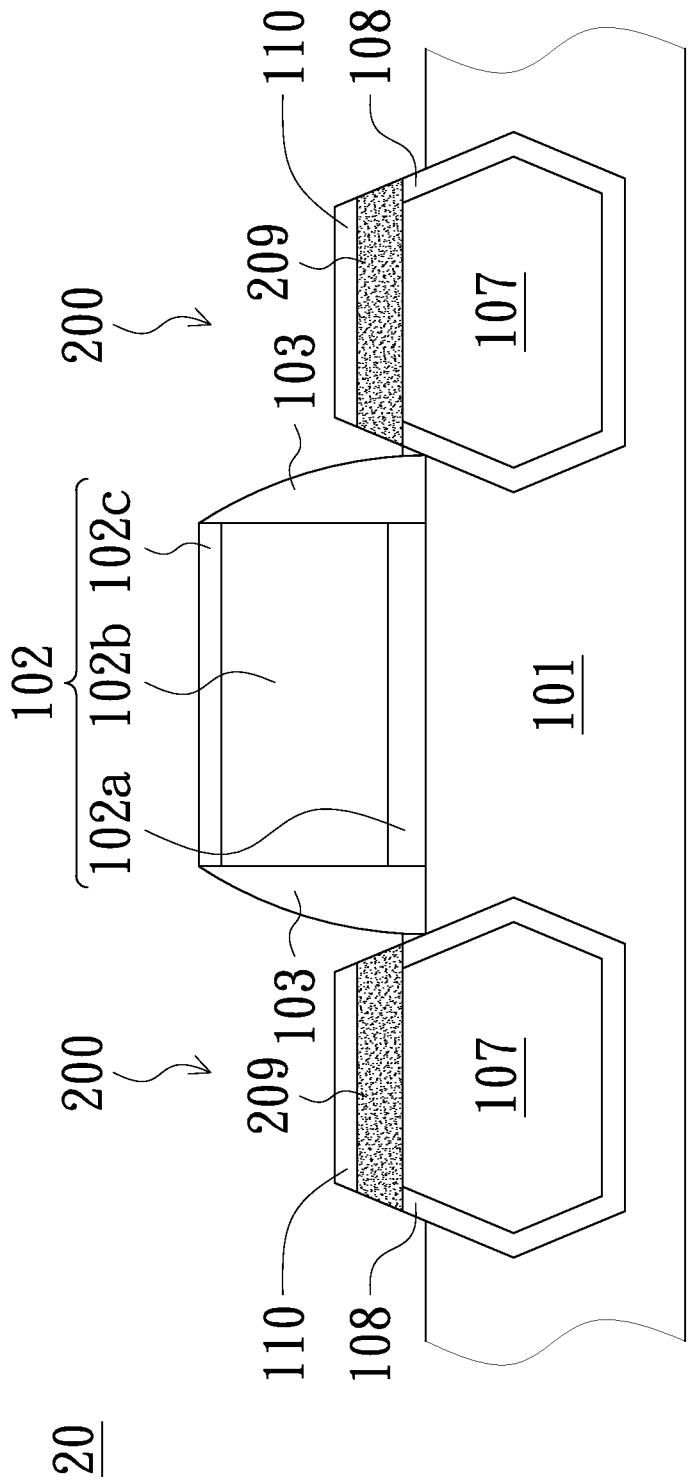
FIG. 2 is a schematic cross-sectional view illustrating a comparison example of a metal-oxide-semiconductor field-effect transistor.
Figure 3:
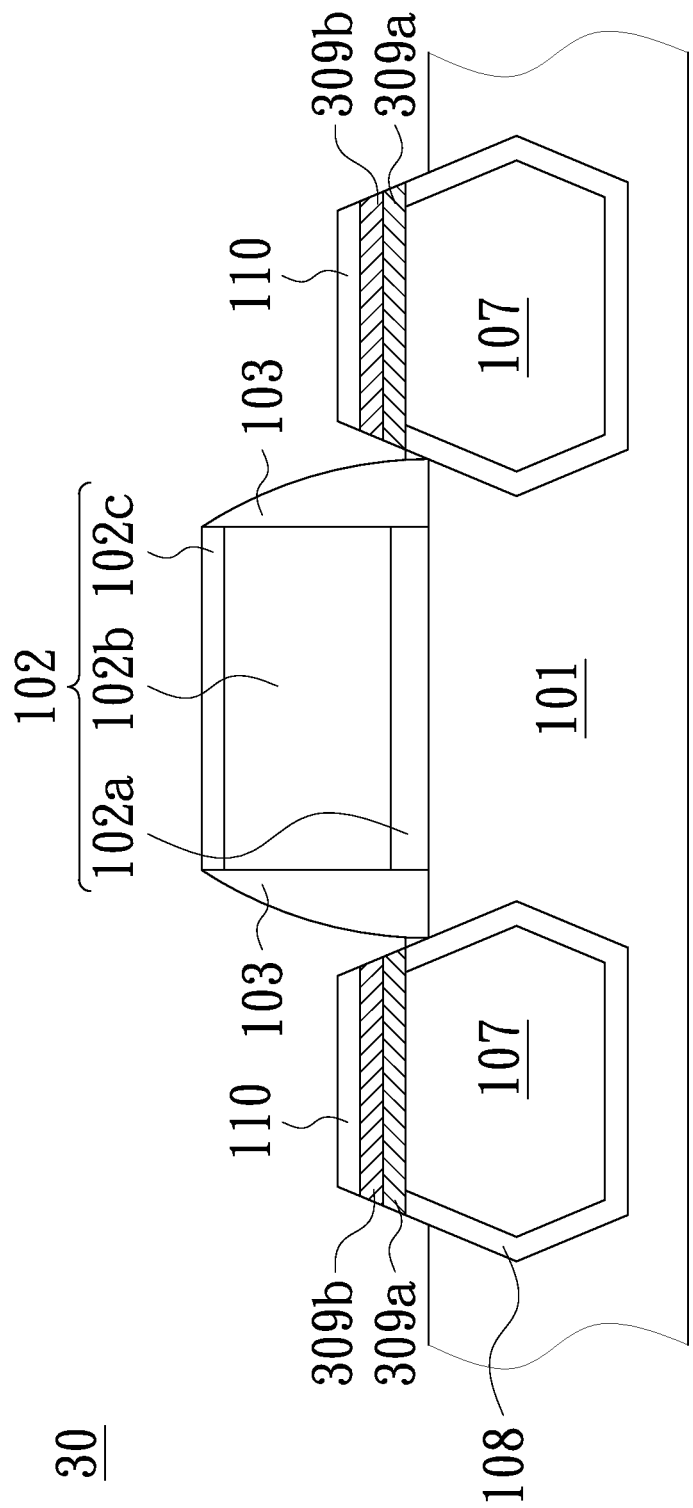
FIG. 3 is a schematic cross-sectional view illustrating another comparison example of a metal-oxide-semiconductor field-effect transistor.

FIG. 2 is a schematic cross-sectional view illustrating a comparison example of a metal-oxide-semiconductor field-effect transistor 20. FIG. 3 is a schematic cross-sectional view illustrating another comparison example of a metal-oxide-semiconductor field-effect transistor 30. The metal-oxide-semiconductor field-effect transistors 20 and 30 are substantially similar to the metal-oxide-semiconductor field-effect transistor 10 as shown in FIG. 1E, except that the compound semiconductor epitaxial structures 200 and 300 are further distinguished from the compound semiconductor epitaxial structure 100, in particular with respect to the material composition and concentration thereof, as follow.

In the compound semiconductor epitaxial structure 100, the silicon germanium epitaxial liner layer 109 has a linearly-decreased concentration gradient of germanium varying with thickness thereof. In the compound semiconductor epitaxial structure 200, the silicon germanium epitaxial liner layer 209 is a single-layered structure having a fixed germanium concentration (e.g. 25 wt %). Whereas, the compound semiconductor epitaxial structure 300 has a first silicon germanium epitaxial liner layer 309a containing 30 wt % of germanium and a second silicon germanium epitaxial liner layer 309b containing 8 wt % of germanium. For clarification and brevity, identical components of the metal-oxide-semiconductor field-effect transistors 10, 20 and 30 are designated by identical numeral references.

The results of the strain and relaxation tests demonstrate that the relaxation percentages for the compound semiconductor epitaxial structures 100, 200 and 300 are respectively 0.43%, 17.01% and 19.82% relative to the silicon germanium epitaxial structure without the liner layer. It is found that the liner layer 109 whose germanium concentration is linearly decreased with thickness thereof is effective in solving the delamination problem resulting from the lattice mismatch between the compound semiconductor epitaxial structure 100 and other material layers. Moreover, the stress relaxation problem of the silicon germanium epitaxial structure resulted from the multilayered silicon germanium epitaxial liner structure will be minimized.

Furthermore, since the liner layer 109 is produced by dynamically adjusting the concentration of the deposition gas and performing a single continuous epitaxial deposition process, the pre-cleaning and pumping & purging process necessary to be performed during the time period between individual processes of forming the silicon germanium epitaxial liner layers 309a and 309b as shown in FIG. 3 may be omitted. In other words, the method for fabricating the compound semiconductor epitaxial structure 100 according to the present invention is simplified. Moreover, the method of the present invention is able to prevent abrupt temperature changes during the time period between individual processes, so that the thermal shock problem is eliminated.

From the above description, the embodiments of present invention provide a compound semiconductor epitaxial structure and a method for fabricating the compound semiconductor epitaxial structure. Firstly, a first compound epitaxial layer is formed in a substrate. Then, by dynamically adjusting the concentration of the deposition gas and performing a single continuous epitaxial deposition process, a second compound epitaxial layer is formed on the first compound epitaxial layer. Consequently, the second compound epitaxial layer has a linearly-decreased concentration gradient of metal. Then, a semiconductor material layer is formed on the second compound epitaxial layer. Since the interfacial lattice mismatch between the compound epitaxial layers is reduced, the stress relaxation problem of the compound epitaxial structure will be minimized and the device performance of the MOSFET will be enhanced.

While the invention has been described in terms of what is presently considered to be the most practical and preferred embodiments, it is to be understood that the invention needs not be limited to the disclosed embodiment. Such that, the material of forming the compound semiconductor epitaxial structure is not limited to the silicon germanium epitaxial material, and the application of the compound semiconductor epitaxial structure is not limited to the metal-oxide-semiconductor field-effect transistor. For example, the compound semiconductor epitaxial structure can be applied by a fin field effect transistor (FINFET). On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a compound semiconductor epitaxial structure, comprising steps of:
    forming an undoped silicon germanium layer having a linearly-increased concentration gradient of germanium on a substrate;
    forming a first compound epitaxial layer on the undoped silicon germanium layer;
    performing a continuous epitaxial deposition process to form a second compound epitaxial layer on the first compound epitaxial layer, so that the second compound epitaxial layer has a linearly-decreased concentration gradient of metal; and
    forming a semiconductor material layer on the second compound epitaxial layer.

2. The method according to claim 1, wherein the first compound epitaxial layer has a metal concentration greater than or equal to an initial concentration of the linearly-decreased concentration gradient of metal.

3. The method according to claim 1, wherein during the step of performing the continuous epitaxial deposition process to form the second compound epitaxial layer, the flow rate of a metal-containing reactive gas is controlled to be linearly decreased.

4. The method according to claim 3, wherein forming the second compound epitaxial layer further comprises keeping the flow rate of the metal-containing reactive gas constant for a predetermined interval of time.

5. The method according to claim 4, wherein the first compound epitaxial layer is a silicon germanium bulk layer, and the metal-containing reactive gas comprises a germane gas.

6. The method according to claim 5, wherein during the step of performing the continuous epitaxial deposition process to form the second compound epitaxial layer, adjusting the flow rates of the germane gas, a hydrogen chloride gas and a diborane gas using a mass flow controller, so that the flow rate of the germane gas is linearly decreased.

7. The method according to claim 5, wherein the first compound epitaxial layer is further boron-doped.

8. The method according to claim 7, wherein during the step of forming the undoped silicon germanium layer, adjusting the flow rates of the germane gas and a hydrogen chloride gas using a mass flow controller, so that the flow rate of the germane gas is linearly increased or is kept constant for a predetermined interval of time.

9. The method according to claim 1, wherein the step of forming the first compound epitaxial layer and the step of forming the second compound epitaxial layer are carried out at the same temperature.

10. A compound semiconductor epitaxial structure, comprising:
   a substrate;
   a first compound epitaxial layer formed on a substrate;
   an undoped silicon germanium layer having a linearly-increased concentration gradient of germanium arranged between the substrate and the first compound epitaxial layer;
   a second compound epitaxial layer formed on the first compound epitaxial layer, wherein the second compound epitaxial layer has a linearly-decreased concentration gradient of metal; and
   a semiconductor material layer formed on the second compound epitaxial layer.

11. The compound semiconductor epitaxial structure according to claim 10, wherein the first compound epitaxial layer has a metal concentration greater than or equal to an initial concentration of the linearly-decreased concentration gradient of metal of the second compound epitaxial layer.

12. The compound semiconductor epitaxial structure according to claim 10, wherein the first compound epitaxial layer is a silicon germanium bulk layer, which contains 40 wt % of germanium and is doped with 25 wt % of boron, wherein the second compound epitaxial layer has a linearly-decreased concentration gradient of germanium.

13. The compound semiconductor epitaxial structure according to claim 10, wherein a top surface of the first compound epitaxial layer is higher than the substrate by a height difference.

14. The compound semiconductor epitaxial structure according to claim 13, wherein the height difference between the top surface of the first compound epitaxial layer and the substrate is in a range between 150 Å and 170 Å.

15. The compound semiconductor epitaxial structure according to claim 10, wherein the second compound epitaxial layer has a thickness smaller than 100 Å.

16. The compound semiconductor epitaxial structure according to claim 15, wherein the thickness of the second compound epitaxial layer is in a range between 30 Å and 100 Å.

* * * * *